US012666744B2

(12) United States Patent
Cho

(10) Patent No.: US 12,666,744 B2
(45) Date of Patent: Jun. 23, 2026

(54) IMAGE SENSOR CHIP INCLUDING ALIGNMENT MARK AND IMAGE SENSOR PACKAGE INCLUDING THE SAME

(71) Applicant: SAMSUNG ELECTRONICS CO., LTD., Suwon-si (KR)

(72) Inventor: Kyoungsoon Cho, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 700 days.

(21) Appl. No.: 18/083,661

(22) Filed: Dec. 19, 2022

(65) Prior Publication Data

US 2023/0261026 A1     Aug. 17, 2023

(30) Foreign Application Priority Data

Feb. 11, 2022     (KR) ........................ 10-2022-0018066

(51) Int. Cl.
*H10F 39/12*          (2025.01)
*H10F 39/00*          (2025.01)
          (Continued)
(52) U.S. Cl.
CPC ....... *H10F 39/811* (2025.01); *H10F 39/8053* (2025.01); *H10F 39/8057* (2025.01);
          (Continued)
(58) Field of Classification Search
CPC ...... H10F 39/18; H10F 39/182; H10F 39/191; H10F 39/192; H10F 39/8053;
          (Continued)

(56) References Cited

U.S. PATENT DOCUMENTS 5,844,687 A     12/1998  Nagane et al.
5,861,654 A      1/1999  Johnson
          (Continued)

FOREIGN PATENT DOCUMENTS

CN          1719614          1/2006
JP      2002334974 A      11/2002
          (Continued)

OTHER PUBLICATIONS

Office Action dated Oct. 1, 2025 issued in corresponding to Korean Patent Application No. 10-2022-0018066.

*Primary Examiner* — Jay C Kim
*Assistant Examiner* — John Lin
(74) *Attorney, Agent, or Firm* — Morgan, Lewis & Bockius LLP

(57)          ABSTRACT

An image sensor chip includes a wiring layer. A semiconductor substrate is on the wiring layer and includes a photoelectric converter. A lattice structure is on the semiconductor substrate. An alignment mark layer is on the semiconductor substrate and is surrounded by the lattice structure in a plan view. Dummy color filters are on the semiconductor substrate and surrounded by the lattice structure in the plan view. An upper planarization layer is on the alignment mark layer and the dummy color filters. A light shielding layer is disposed between the semiconductor substrate and the alignment mark layer and between the semiconductor substrate and the dummy color filters. The alignment mark layer and the dummy color filters are disposed at a same level with respect to a top surface of the semiconductor substrate. The dummy color filters surround at least a portion of the alignment mark layer in the plan view.

20 Claims, 7 Drawing Sheets

(51) Int. Cl.
    *H10F 39/18*       (2025.01)
    *H10W 46/00*     (2026.01)

(52) U.S. Cl.
    CPC ........ *H10F 39/8063* (2025.01); *H10W 46/00*
              (2026.01); *H10W 46/301* (2026.01)

(58) Field of Classification Search
    CPC .............. H10F 39/8057; H10F 39/806; H10F
               39/8063; H10F 39/8067; H10W 46/00;
                    H10W 46/201; H10W 46/301
    See application file for complete search history.

(56) References Cited

U.S. PATENT DOCUMENTS

| | | | | |
|---|---|---|---|---|
| 6,133,062 A * | 10/2000 | Pai ........................ | H10F 39/182 |
| | | | 438/70 |
| 8,138,533 B2 | 3/2012 | Koike et al. | |
| 8,552,516 B2 | 10/2013 | Murakoshi et al. | |
| 9,837,459 B2 | 12/2017 | Kashihara | |
| 10,192,915 B1 | 1/2019 | Wang et al. | |
| 2004/0033689 A1* | 2/2004 | Ho .................... | H10W 10/0143 |
| | | | 257/E23.179 |
| 2020/0043962 A1* | 2/2020 | Cho .................... | H10F 39/8063 |
| 2021/0036179 A1 | 2/2021 | Sung et al. | |

FOREIGN PATENT DOCUMENTS

| | | |
|---|---|---|
| JP | 2006128371 A | 5/2006 |
| JP | 2011-14674 | 1/2011 |
| JP | 2019197839 A | 11/2019 |
| KR | 10-2008-0079490 | 9/2008 |

* cited by examiner

FIG. 6

IMAGE SENSOR CHIP INCLUDING ALIGNMENT MARK AND IMAGE SENSOR PACKAGE INCLUDING THE SAME

CROSS-REFERENCE TO RELATED APPLICATION(S)

This application claims priority under 35 U.S.C. § 119 to Korean Patent Application No. 10-2022-0018066, filed on Feb. 11, 2022 in the Korean Intellectual Property Office, the disclosure of which is incorporated by reference in its entirety herein.

1. TECHNICAL FIELD

Embodiments of the present disclosure relate to an image sensor chip including an alignment mark and an image sensor package including the same.

2. DISCUSSION OF RELATED ART

During the manufacturing of an image sensor package, an alignment mark may be utilized for aligning a glass or a protective tape that is attached to the image sensor package. In some embodiments, an alignment mark may be utilized for aligning the image sensor package with respect to a tray upon placing the image sensor package into the tray.

Therefore, an alignment mark may be formed on a glass included in an image sensor package. An additional exposure process may be performed in a conventional image sensor package manufacturing method for forming the alignment mark on the glass. However this may increase the manufacturing costs.

SUMMARY

Embodiments of the present disclosure provide an image sensor package including an alignment mark usable for increasing alignment accuracy while reducing manufacturing costs of the image sensor package.

According to an embodiment of the present disclosure, an image sensor chip includes a wiring layer. A semiconductor substrate is on the wiring layer and includes a photoelectric converter. A lattice structure is on the semiconductor substrate. An alignment mark layer is on the semiconductor substrate and is surrounded by the lattice structure in a plan view. Dummy color filters are on the semiconductor substrate and surrounded by the lattice structure in the plan view. An upper planarization layer is on the alignment mark layer and the dummy color filters. A light shielding layer is disposed between the semiconductor substrate and the alignment mark layer and between the semiconductor substrate and the dummy color filters. The alignment mark layer and the dummy color filters are disposed at a same level with respect to a top surface of the semiconductor substrate. The dummy color filters surround at least a portion of the alignment mark layer in the plan view.

According to an embodiment of the present disclosure, an image sensor chip includes a semiconductor substrate comprising an active pixel region and a dummy pixel region. A lattice structure is on the semiconductor substrate. Color filters are disposed in the active pixel region on the semiconductor substrate. An alignment mark layer is disposed in the dummy pixel region on the semiconductor substrate. Dummy color filters are disposed in the dummy pixel region on the semiconductor substrate. An upper planarization layer is on the color filters, the alignment mark layer and the dummy color filters. A light shielding layer is disposed between the semiconductor substrate and the alignment mark layer and between the semiconductor substrate and the dummy color filters in the dummy pixel region. The alignment mark layer and the dummy color filters are disposed at a same level with respect to a top surface of the semiconductor substrate. The dummy color filters surround at least a portion of the alignment mark layer in a plan view.

According to an embodiment of the present disclosure, an image sensor package includes a base substrate. An image sensor chip is disposed on the base substrate. A transparent protective cover is disposed on the image sensor chip. A dam is disposed between the image sensor chip and the transparent protective cover. A mold layer directly contacts a portion of a top surface of the base substrate and lateral side surfaces of the image sensor chip, the dam and the transparent protective cover. The image sensor chip includes a semiconductor substrate comprising an active pixel region and a dummy pixel region. A lattice structure is on the semiconductor substrate. Color filters are disposed in the active pixel region on the semiconductor substrate. An alignment mark layer is disposed in the dummy pixel region on the semiconductor substrate. Dummy color filters are disposed in the dummy pixel region on the semiconductor substrate. A light shielding layer is disposed between the semiconductor substrate and the alignment mark layer and between the semiconductor substrate and the dummy color filters in the dummy pixel region. The alignment mark layer and the dummy color filters are disposed at a same level with respect to a top surface of the semiconductor substrate. The dummy color filters surround at least a portion of the alignment mark layer in a plan view.

BRIEF DESCRIPTION OF THE DRAWINGS

FIG. 6 is a cross-sectional view of an image sensor chip according to an embodiment of the present disclosure.

DETAILED DESCRIPTION OF EMBODIMENTS

Figure 1:
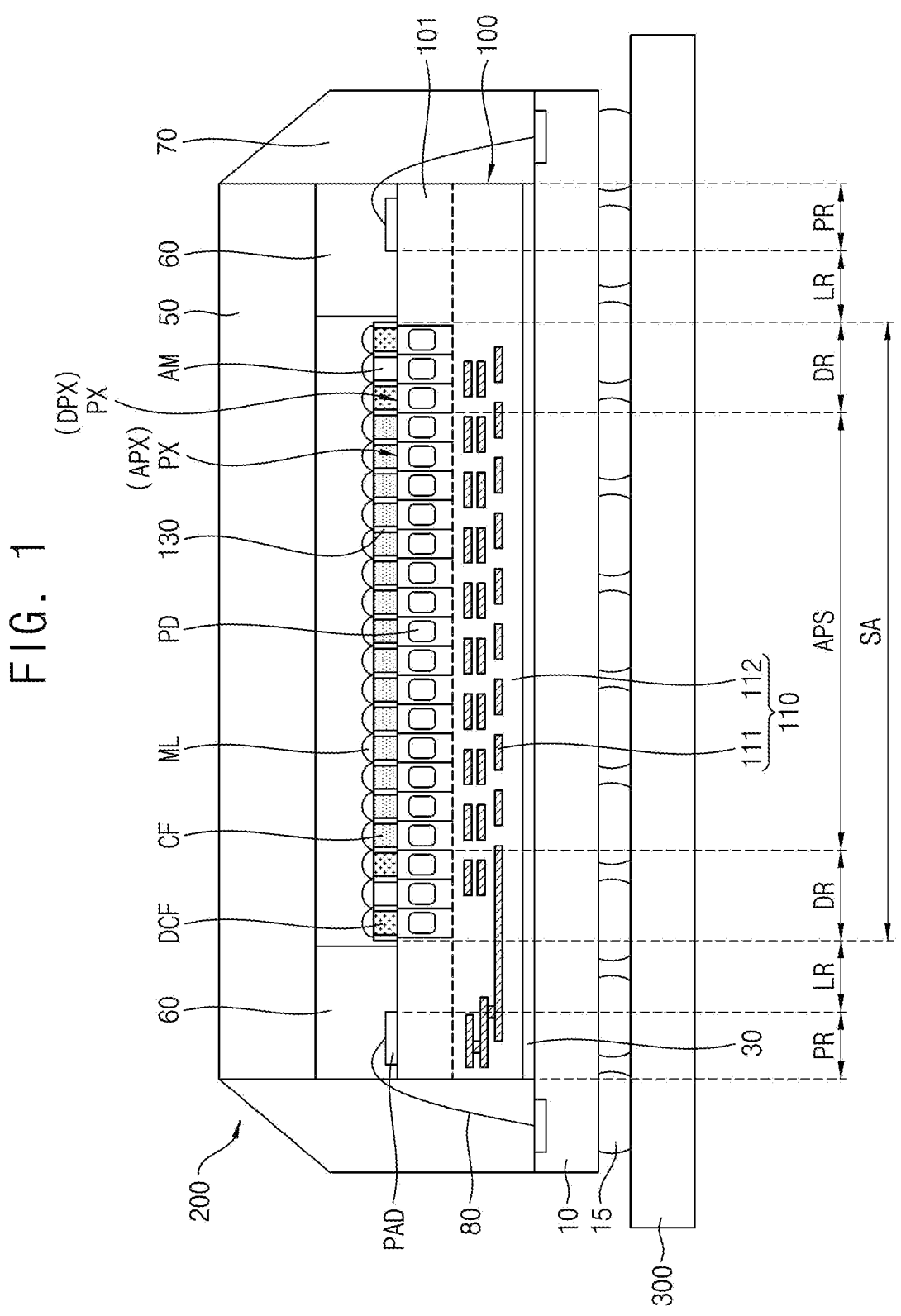
FIG. 1 is a schematic cross-sectional view of an image sensor package including an image sensor chip according to an embodiment of the present disclosure.
Figure 2:
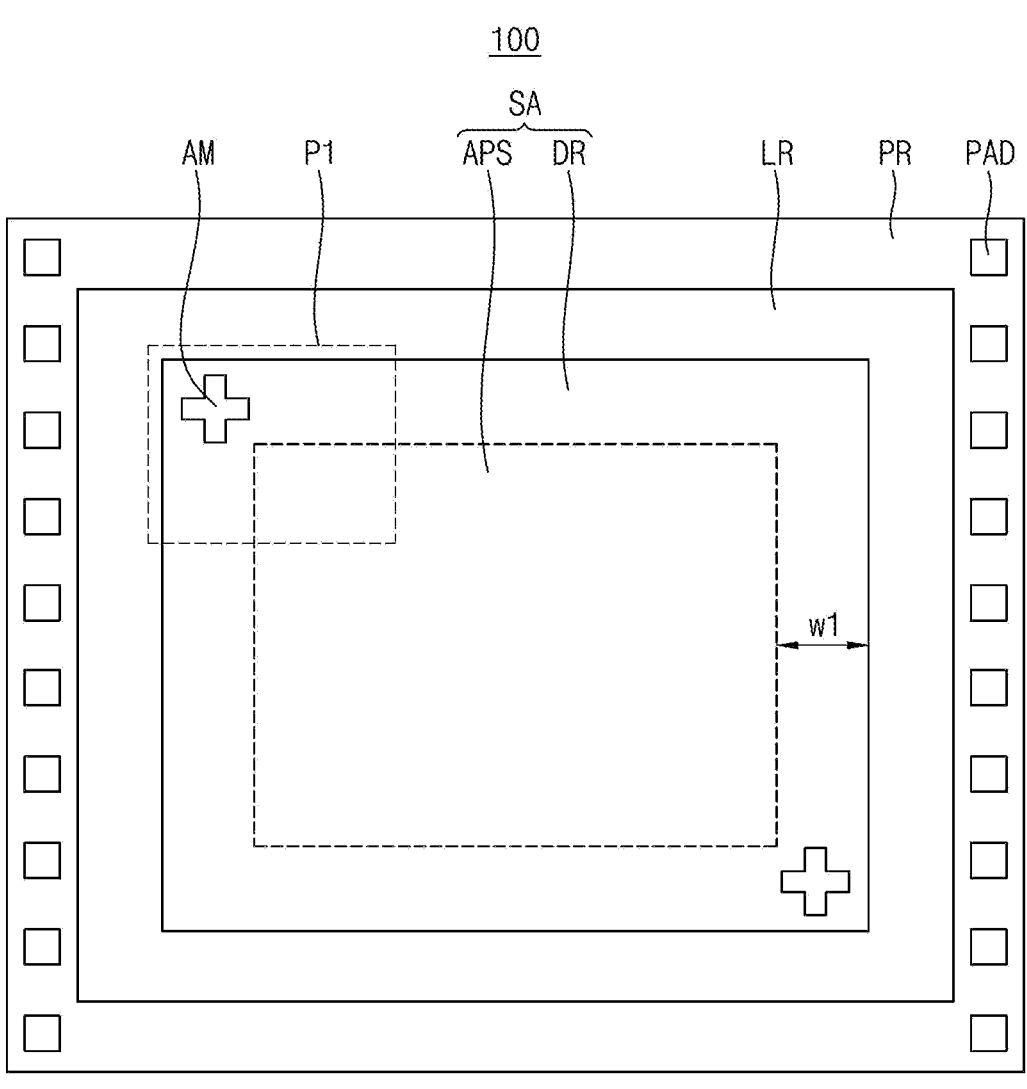
FIG. 2 is a schematic plan view of the image sensor chip included in the image sensor package of FIG. 1 according to an embodiment of the present disclosure.

FIG. 1 is a schematic cross-sectional view of an image sensor package including an image sensor chip. FIG. 2 is a schematic plan view of the image sensor chip included in the image sensor package of FIG. 1.

Referring to FIG. 1, an image sensor package 200 may include a base substrate 10, an image sensor chip 100, a transparent protective cover 50, a dam 60, and a mold layer 70.

The image sensor chip 100 may be disposed on the base substrate 10. An adhesive film 30 may be interposed between the base substrate 10 and the image sensor chip 100. The image sensor chip 100 may be attached to the base substrate 10 via the adhesive film 30. The adhesive film 30 may include a material having adhesion.

The transparent protective cover 50 may be disposed on the image sensor chip 100. For example, the transparent protective cover 50 may be positioned above the image sensor chip 100. The transparent protective cover 50 may include a material allowing light to pass therethrough. For example, in an embodiment the transparent protective cover 50 may be glass. Accordingly, light may be incident toward the image sensor chip 100 after passing through the transparent protective cover 50. In an embodiment, the transparent protective cover 50 may completely vertically overlap with the image sensor chip 100.

The dam 60 may be disposed on the image sensor chip 100. The dam 60 may be disposed between the image sensor chip 100 and the transparent protective cover 50 (e.g., in a vertical direction). The dam 60 may attach the transparent protective cover 50 to the image sensor chip 100. In an embodiment, the dam 60 may extend along lateral edges of the image sensor chip 100 and the transparent protective cover 50. For example, in an embodiment, in a plan view, the dam 60 may have the form of a rectangular ring arranged along the lateral edge of the image sensor chip 100. For example, the dam 60 may include an adhesive glue such as an ultraviolet (UV) glue.

The mold layer 70 may be disposed on the base substrate 10. The mold layer 70 may be disposed at an edge of the base substrate 10, and may cover outer lateral side surfaces of the image sensor chip 100, the dam 60 and the transparent protective cover 50. The mold layer 70 may directly contact a portion of a top surface of the base substrate 10 and outer lateral side surfaces of each of the image sensor chip 100, the dam 60 and the transparent protective cover 50. In an embodiment, the mold layer 70 may include an inclined surface. For example, as shown in an embodiment of FIG. 1, an upper surface of the mold layer 70 may have an inclined surface. The inclined surface of the mold layer 70 may interconnect an inner side surface and an outer side surface of the mold layer 70. In an embodiment, the inclined surface of the mold layer 70 may have a height gradually decreasing as the inclined surface extends from an inside to an outside of the image sensor package 200. For example, in an embodiment the mold layer 70 may include an epoxy molding compound (EMC). However, embodiments of the present disclosure are not necessarily limited thereto.

In an embodiment, the image sensor package 200 may be mounted on a main board 300, and the main board 300 may be, for example, a printed circuit board. However, embodiments of the present disclosure are not necessarily limited thereto. Outer connection terminals 15 may be connected to a bottom surface of the base substrate 10. The image sensor package 200 may be mounted on the main board 300 via the outer connection terminals 15. The image sensor package 200 may be electrically connected to the main board 300 via the outer connection terminals 15. For example, in an embodiment the outer connection terminals 15 may be solder balls. However, embodiments of the present disclosure are not necessarily limited thereto.

In an embodiment, the image sensor chip 100 may include a semiconductor substrate 101, a wiring layer 110, color filters CF, dummy color filters DCF, an alignment mark layer AM, and a microlens ML.

The semiconductor substrate 101 may include a semiconductor material. For example, in an embodiment, the semiconductor substrate 101 may include silicon. However, embodiments of the present disclosure are not necessarily limited thereto. For example, in an embodiment the semiconductor substrate 101 may include a semiconductor element such as germanium, or may include a compound semiconductor such as silicon carbide (SiC), gallium arsenide (GaAs), indium arsenide (InAs), and indium phosphide (InP).

Referring to FIGS. 1 and 2, the semiconductor substrate 101 may include a sensor array region SA, a logic region LR, and a pad region PR. The sensor array region SA may be disposed at a central portion of the semiconductor substrate 101. The sensor array region SA may have a rectangular shape. In an embodiment, the sensor array region SA may include a plurality of unit pixels PX disposed in the form of a matrix. The unit pixels PX may be defined by a device isolation layer 120 (FIG. 4) in the semiconductor substrate 101. Each of the unit pixels PX may include a photoelectric converter and a transistor. Although 21 unit pixels PX are shown in an embodiment of FIG. 1, the number of unit pixels PX included in the sensor array region SA is not necessarily limited thereto and may vary.

In an embodiment, the sensor array region SA may include an active pixel region APS and a dummy pixel region DR. The dummy pixel region DR may be disposed outside the active pixel region APS. The dummy pixel region DR may surround (e.g., completely surround in a plan view) the active pixel region APS. Although the entirety of the dummy pixel region DR is shown as being disposed along four edges of the active pixel region APS, embodiments of the present disclosure are not necessarily limited thereto. For example, in an embodiment, the dummy pixel region DR may be disposed along only a portion of the edges of the active pixel region APS. Active pixels APX of the unit pixels PX may be disposed in the active pixel region APS, whereas dummy pixels DPX of the unit pixels PX may be disposed in the dummy pixel region DR. The dummy pixel DPX may mean a unit pixel PX disposed in the dummy pixel region DR without functioning as an active pixel APX. In an embodiment, a minimum width W1 of the dummy pixel region DR may be in a range of about 100 to about 1,500 μm. However, embodiments of the present disclosure are not necessarily limited thereto and the minimum width W1 of the dummy pixel region DR may be varied in accordance with the area of the sensor array region SA.

In an embodiment, the dummy pixel region DR may be a region functioning as an etch stop layer preventing an occurrence of dishing in a planarization process for the semiconductor substrate 101, thereby preventing occurrence of patterning failure in a process for color filter formation on the active pixel region APS.

The logic region LR may be disposed along an edge of the sensor array region SA. Although the entirety of the logic region LR is shown as being disposed along four edges of the sensor array region SA to completely surround the sensor array region SA in a plan view in an embodiment of FIG. 2, embodiments of the present disclosure are not necessarily limited thereto. For example, in an embodiment, the logic region LR may be disposed along one edge, two edges or three edges of the sensor array region SA. Transistors for driving of the image sensor chip 100 may be disposed in the logic region LR.

The pad region PR may be disposed in an edge region of the image sensor chip 100. The pad region PR may surround (e.g., completely surround) the logic region LR and the sensor array region SA in a plan view. Pads PAD may be disposed in the pad region PR. The pads PAD may be electrically connected to the base substrate 10 via wires 80.

In an embodiment, the logic region LR may be omitted between the sensor array region SA and the pad region PR. In an embodiment, the image sensor chip 100 may further include a logic chip disposed under the semiconductor substrate 101 while including transistors.

Photoelectric converters PD may be disposed in the semiconductor substrate 101. The photoelectric converters PD may be disposed in the sensor array region SA. The photoelectric converters PD may be disposed to correspond to a plurality of unit pixels PX, respectively. The photoelectric converters PD may collect light incident thereupon from a top surface of the semiconductor substrate 101. The photoelectric converters PD may have a conductivity type different from that of the semiconductor substrate 101.

The wiring layer 110 may be disposed under the semiconductor substrate 101. The wiring layer 110 may contact (e.g., directly contact) a bottom surface of the semiconductor substrate 101. The wiring layer 110 may include wiring patterns 111 electrically connected to the photoelectric converters PD and the transistors. For example, the wiring patterns 111 may include a metal material such as copper, aluminum, nickel, tungsten, etc. The wiring layer 110 may include an insulating layer 112 covering the wiring patterns 111. In an embodiment, when the image sensor chip 100 includes a logic chip, the logic chip may be disposed under the wiring layer 110.

The color filters CF may be disposed on the semiconductor substrate 101 (e.g., disposed directly thereon). The color filters CF may be disposed in the active pixel region APS within the sensor array region SA. The color filters CF may be disposed to correspond to active pixels APX in a plurality of unit pixels PX, respectively. The color filters CF may be disposed to correspond to photoelectric converters PD in the active pixels APX, respectively.

The dummy color filters DCF may be disposed on the semiconductor substrate 101 (e.g., disposed directly thereon). The dummy color filters DCF may be disposed in the dummy pixel region DR within the sensor array region SA. The dummy color filters DCF may be disposed to correspond to dummy pixels DPX in a plurality of unit pixels PX, respectively. The dummy color filters DCF may be disposed to correspond to photoelectric converters PD in the dummy pixels DPX, respectively.

The alignment mark layer AM may be disposed on the semiconductor substrate 101 (e.g., disposed directly thereon). The alignment mark layer AM may be disposed in the dummy pixel region DR within the sensor array region SA. The alignment mark layer AM may be disposed adjacent to the dummy color filters DCF. For example, as shown in an embodiment of FIG. 1, the alignment mark layer AM may be disposed directly between two dummy color filters DCF that are adjacent to each other. In an embodiment as shown in FIG. 2, the alignment mark layer AM may be disposed adjacent to a corner of the dummy pixel region DR and a corner portion of the active pixel region APS. However, embodiments of the present disclosure are not necessarily limited thereto. One alignment mark layer AM or a plurality of alignment mark layers AM may be disposed in the dummy pixel region DR.

A microlens ML may be disposed on the color filters CF, the dummy color filters DCF, and the alignment mark layer AM. In an embodiment, microlenses ML may be disposed to correspond to the color filters CF, the dummy color filters DCF, and the alignment mark layer AM, respectively. The microlens ML may change a path of light incident upon regions other than a photoelectric converter PD and, as such, may collect the light onto the photoelectric converter PD.

Figure 3:
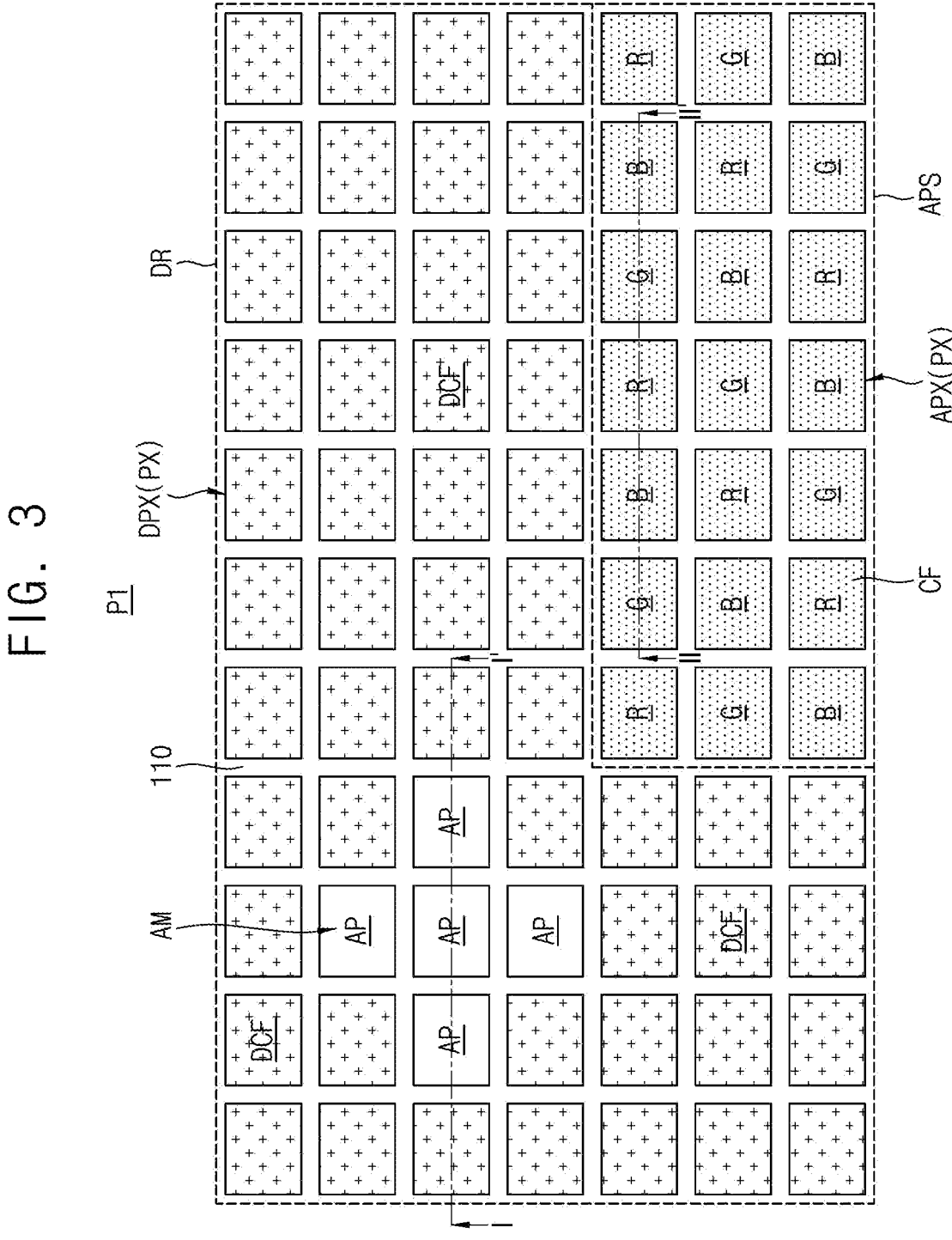
FIG. 3 is an enlarged plan view showing the image sensor chip taken from region P1 of FIG. 2 according to an embodiment of the present disclosure.
Figures 4, 5:
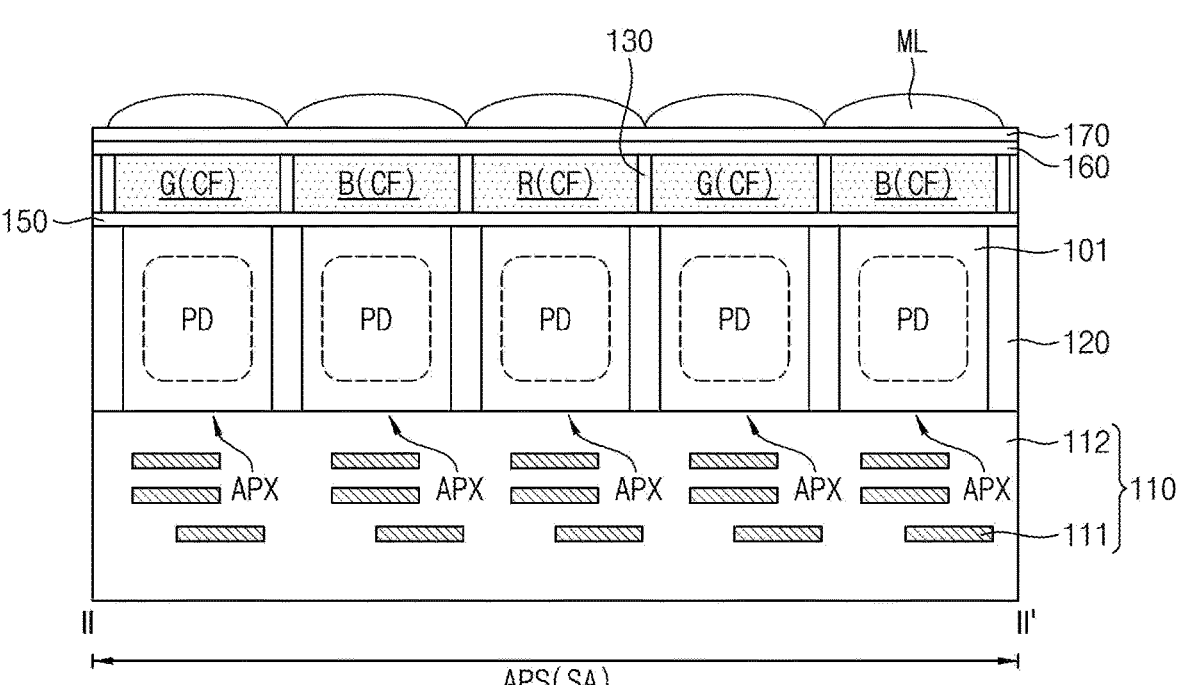
FIG. 4 is a cross-sectional view of the image sensor chip taken along line I-I' of FIG. 2 according to an embodiment of the present disclosure.
FIG. 5 is a cross-sectional view of the image sensor chip taken along line II-II' of FIG. 2 according to an embodiment of the present disclosure.

FIG. 3 is an enlarged plan view showing a region P1 of FIG. 2. FIG. 4 is a cross-sectional view taken along line I-I' in FIG. 2. FIG. 5 is a cross-sectional view taken along line II-II' in FIG. 2.

Referring to FIGS. 3 to 5, the device isolation layer 120 may be disposed in the semiconductor substrate 101. The device isolation layer 120 may define a plurality of unit pixels PX. The device isolation layer 120 may define dummy pixels DPX in the dummy pixel region DR. The device isolation layer 120 may define active pixels APX in the active pixel region APS. The device isolation layer 120 may have a grid or mesh shape in a plan view. Accordingly, the dummy pixels DPX and the active pixels APX defined by the device isolation layer 120 may be arranged in the form of a matrix in a plan view. The device isolation layer 120 may completely extend through the semiconductor substrate 101 in a direction perpendicular to the top surface of the semiconductor substrate 101. In an embodiment, the device isolation layer 120 may incompletely extend through the semiconductor substrate 101 while extending in the direction perpendicular to the top surface of the semiconductor substrate 101. For example, the device isolation layer 120 may include an insulating material.

Photoelectric converters PD may be formed at the active pixels APX and the dummy pixels PD, respectively. The photoelectric converters PD may be arranged in the form of a matrix in a plan view. The device isolation layer 120 may extend directly between photoelectric converters PD that are adjacent to each other. The device isolation layer 120 may optically and/or electrically separate the adjacent photoelectric converters PD from each other.

A lattice structure 130 may be disposed on the semiconductor substrate 101. The lattice structure 130 may have a grid or mesh shape in a plan view. In an embodiment, the lattice structure 130 may include a metal material. For example, in an embodiment the lattice structure 130 may include at least one metal material selected from tungsten, aluminum, titanium, ruthenium, cobalt, nickel, copper, gold, silver and platinum. However, embodiments of the present disclosure are not necessarily limited thereto. The lattice structure 130 may prevent light incident upon one active pixel APX from being incident upon an active pixel APX that is adjacent thereto. In an embodiment, the lattice structure 130 may have a maximum height in a range of about 5 to about 10 μm. The lattice structure 130 may have a minimum width in a range of about 1 to about 5 μm. In an embodiment, the lattice structure 130 may overlap the device isolation layer 120 (e.g., in the vertical direction).

The dummy color filters DCF and the alignment mark layer AM may be disposed on the semiconductor substrate 101 in the dummy pixel region DR. Each of the dummy color filters DCF may be surrounded by the lattice structure 130 in a plan view. The dummy color filters DCF may be disposed to correspond to the dummy pixels DPX, respectively. The dummy color filters DCF may vertically overlap with the photoelectric converter PD in the dummy pixel DPX. In an embodiment, the dummy color filters DCF may include a blue filter and/or a black filter. For example, each of the dummy color filters DCF may be a blue filter or a black filter. For example, the dummy color filters DCF may include at least one of a blue filter and a black filter. However, embodiments of the present disclosure are not necessarily limited thereto and the colors of the dummy color filters DCF may vary. In an embodiment, the dummy color filter DCF may include a photoresist material.

The alignment mark layer AM may be surrounded by the lattice structure 130 in a plan view. The alignment mark layer AM may be disposed to correspond to the dummy pixels DPX. The alignment mark layer AM may vertically overlap with the photoelectric converters PD in the dummy pixels DPX. In an embodiment, the alignment mark layer AM may be disposed at the same level as the dummy color filter DCF with respect to the top surface of the semiconductor substrate 101. A bottom surface of the alignment mark layer AM may have the same level as a bottom surface of the dummy color filter DCF, and a top surface of the alignment mark layer AM has the same level as a top surface of the dummy color filter DCF. For example, the top and bottom surfaces of the alignment mark layer AM and the dummy color filter DCF may be co-planar with each other (e.g., in the vertical direction), respectively. The alignment mark layer AM may include a material different from a material constituting the dummy color filter DCF such that the two materials are distinguished from each other. For example, in an embodiment the alignment mark layer AM may not include a photoresist material. In an embodiment, the alignment mark layer AM may include an acrylate-group material (e.g., acrylate) and, for example, may include silicon acrylate. However, embodiments of the present disclosure are not necessarily limited thereto In an embodiment, at least a portion of the alignment mark layer AM may be surrounded by the dummy color filters DCF. The dummy color filters DCF may be disposed around the alignment mark layer AM, and may surround the alignment mark layer AM in a plan view. The alignment mark layer AM may be disposed among the dummy color filters DCF.

In an embodiment, the alignment mark layer AM may include a plurality of alignment mark patterns AP. Each of the plurality of alignment mark patterns AP may be surrounded by the lattice structure 130 in a plan view. In an embodiment, adjacent alignment mark patterns AP of the plurality of alignment mark patterns AP may be spaced apart from one another by the lattice structure 130. The plurality of alignment mark patterns AP may be disposed to be adjacent to each other under the condition that the lattice structure 130 is interposed directly therebetween. In an embodiment, the alignment mark patterns AP may be disposed to form a particular shape recognizable as an alignment mark in a plan view. For example, the alignment mark patterns AP may be disposed to form a cross shape, as shown in FIGS. 2 and 3. However, embodiments of the disclosure are not necessarily limited to the above-described condition and the shape of the alignment mark patterns AP may vary. For example, in an embodiment the shape of the alignment mark patterns AP may various other recognizable shapes.

The color filters CF may be disposed on the semiconductor substrate 101 in the active pixel region APS. Each of the color filters CF may be surrounded by the lattice structure 130 in a plan view. The color filters CF may be disposed to correspond to the active pixels APX, respectively. The color filters CF may allow light of a particular wavelength to pass therethrough such that such light reaches a photoelectric converter PD. In an embodiment, the color filters CF may include a red filter, a green filter, and a blue filter. However, embodiments of the present disclosure are not necessarily limited to the above-described condition and the color filters CF may include various different colors. For example, in an embodiment the color filters CF may include at least one of a cyan filter, a yellow filter, a magenta filter, a white filter, a black filter, an infrared (IR) cutoff filter, an IR pass filter, or a bandpass filter allowing light of a particular wavelength band to pass therethrough. The color filters CF may include a photoresist material. For example, the color filters CF may include a photoresist material mixed with a pigment including a metal or metal oxide.

In an embodiment, a light shielding layer 140 may be disposed in the dummy pixel region DR. The light shielding layer 140 may be disposed on the semiconductor substrate 101 (e.g., disposed directly thereon). In an embodiment, the light shielding layer 140 may be disposed to cover the entire area of the dummy pixel region DR on the semiconductor substrate 101. The light shielding layer 140 may not be disposed in the active pixel region APS. The light shielding layer 140 may be disposed between the semiconductor substrate 101 and the dummy color filters DCF (e.g., in the vertical direction), and may be disposed between the semiconductor substrate 101 and the alignment mark layer AM (e.g., in the vertical direction). The light shielding layer 140 may be disposed between the semiconductor substrate 101 and the lattice structure 130 (e.g., in the vertical direction). For example, in an embodiment the light shielding layer 140 may include at least one metal material selected from tungsten, aluminum, titanium, ruthenium, cobalt, nickel, copper, gold, silver and platinum. The light shielding layer 140 may prevent light from being incident upon the dummy pixels DPX. The thickness of the light shielding layer 140 may be varied in accordance with the material of the light shielding layer 140. For example, in an embodiment in which the light shielding layer 140 is made of tungsten, the light shielding layer 140 may have a thickness in a range of about 2,000 to about 3,000 Å.

A lower planarization layer 150 may be disposed between the semiconductor substrate 101 and the lattice structure 130 (e.g., in the vertical direction). The lower planarization layer 150 may be disposed on the light shielding layer 140 in the dummy pixel region DR. For example, in an embodiment the lower planarization layer 150 may be disposed directly on the light shielding layer 140 in the dummy pixel region DR. The lower planarization layer 150 may be disposed between the light shielding layer 140 and the lattice structure 130, between the light shielding layer 140 and the dummy color filters DCF and between the light shielding layer 140 and the alignment mark layer AM in the dummy pixel region DR. The lower planarization layer 150 may be disposed directly on the semiconductor substrate 101 in the active pixel region APS. The lower planarization layer 150 may be disposed between the semiconductor substrate 101 and the lattice structure 130 and between the semiconductor substrate 101 and the color filters CF in the active pixel region APS. However, embodiments of the present disclosure are not necessarily limited thereto. For example, in an embodiment, the lower planarization layer 150 may be disposed between the semiconductor substrate 101 and the light shielding layer 140 in the dummy pixel region DR.

In an embodiment, the lower planarization layer 150 may include an $Al_2O_3$ layer. For example, the $Al_2O_3$ layer may have a thickness in a range of about 100 to about 200 Å. In an embodiment, the lower planarization layer 150 may further include one or more additional layers different from the $Al_2O_3$ layer. For example, in an embodiment the additional layers may include at least one compound selected from CeF, $HfO_2$, ITO, MgO, $Ta_2Os$, $TiO_2$, $RO_2$, Si, Ge, ZnSe, ZnS, or $PbF_2$. Alternatively, the additional layers may be formed of an organic material having a high refractive index and, for example, may include at least one material selected from a siloxane resin, benzocyclobutene (BCB), a polyimide-group material, an acryl-group material, parylene C, poly(methyl methacrylate) (PMMA), or polyethylene terephthalate (PET).

An upper planarization layer 160 may be disposed on the lattice structure 130, the dummy color filters DCF, the color filters CF, and the alignment mark layer AM. The upper planarization layer 160 may cover a top surface of each of the dummy color filters DCF, the color filters CF and the alignment made layer AM. In an embodiment, the upper planarization layer 160 may include an acrylate-group material. In an embodiment, the upper planarization layer 160 may include the same material as the alignment mark layer AM. In an embodiment in which the upper planarization layer 160 and the alignment mark layer AM are formed of the same material, the upper planarization layer 160 and the alignment mark layer AM may be formed to be integrated with each other (e.g., integral with each other). In an embodiment, the upper planarization layer 160 may have a thickness in a range of about 10,000 to about 15,000 Å.

An insulating layer 170 may be disposed on the upper planarization layer 160. In an embodiment, the insulating layer 170 may be a low temperature oxide (LTO) layer or a low-low temperature oxide (LLTO) layer which is a type of silicon oxide layer. In an embodiment in which the insulating layer 170 is formed of a low temperature oxide (LTO) or a low-low temperature oxide (LLTO), it may be possible to minimize damage to layers disposed under the insulating layer 170 due to the insulating layer 170. In addition, the insulating layer 170, which is formed of a low temperature oxide (LTO) or a low-low temperature oxide (LLTO), is amorphous and, as such, a surface thereof may not be rough. Accordingly, the insulating layer 170 may reduce reflection, refraction and/or scattering of incident light.

The microlens ML may be disposed on the insulating layer 170.

Figure 6:
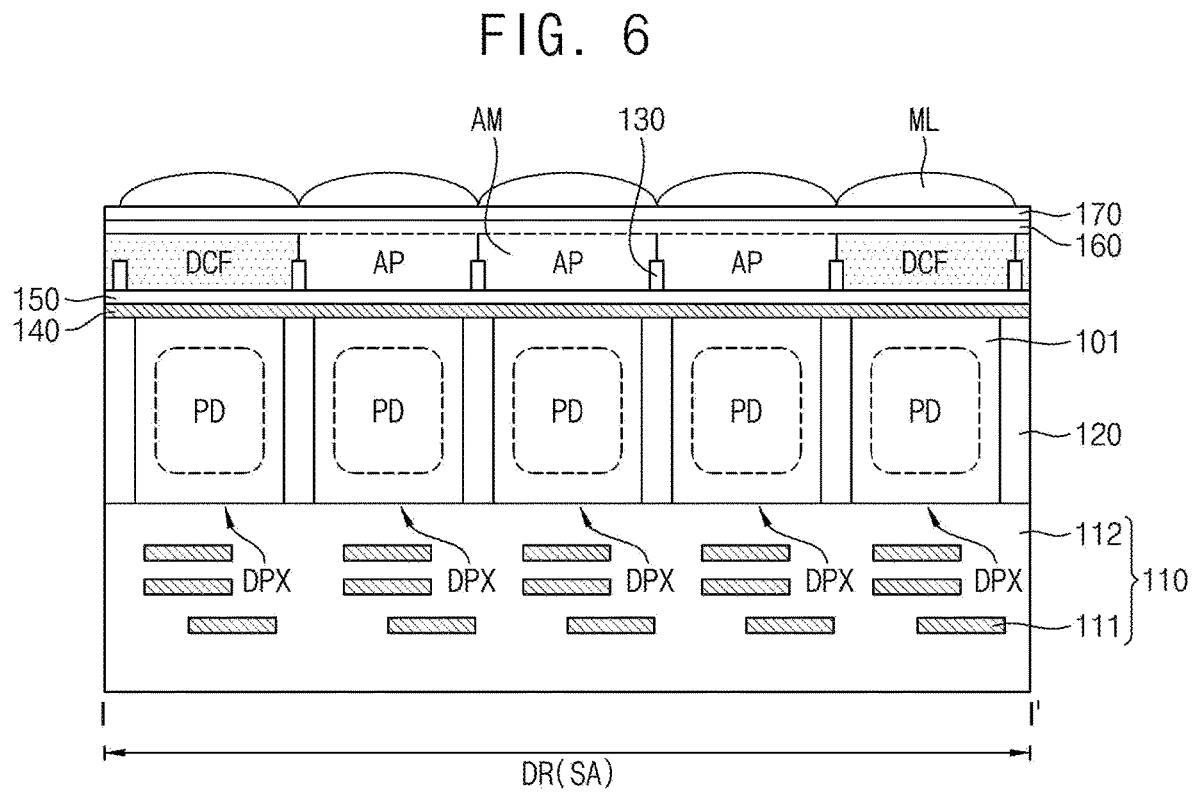

FIG. 6 is a cross-sectional view of an image sensor chip according to an embodiment of the present disclosure.

Referring to FIG. 6, a lattice structure 130 may have a height that is less than heights of the dummy color filters DCF and an alignment mark layer AM. The height of the lattice structure 130 may be less than the height of color filters CF. The alignment mark layer AM may cover a top surface of the lattice structure 130 disposed adjacent thereto. A plurality of alignment mark patterns AP included in the alignment mark layer AM may extend over the lattice structure 130 and, as such, may be interconnected with each other. As the plurality of alignment mark patterns AP is interconnected with each other, the alignment mark layer AM, in which the plurality of alignment mark patterns AP is integrated, may be formed.

Figure 7:
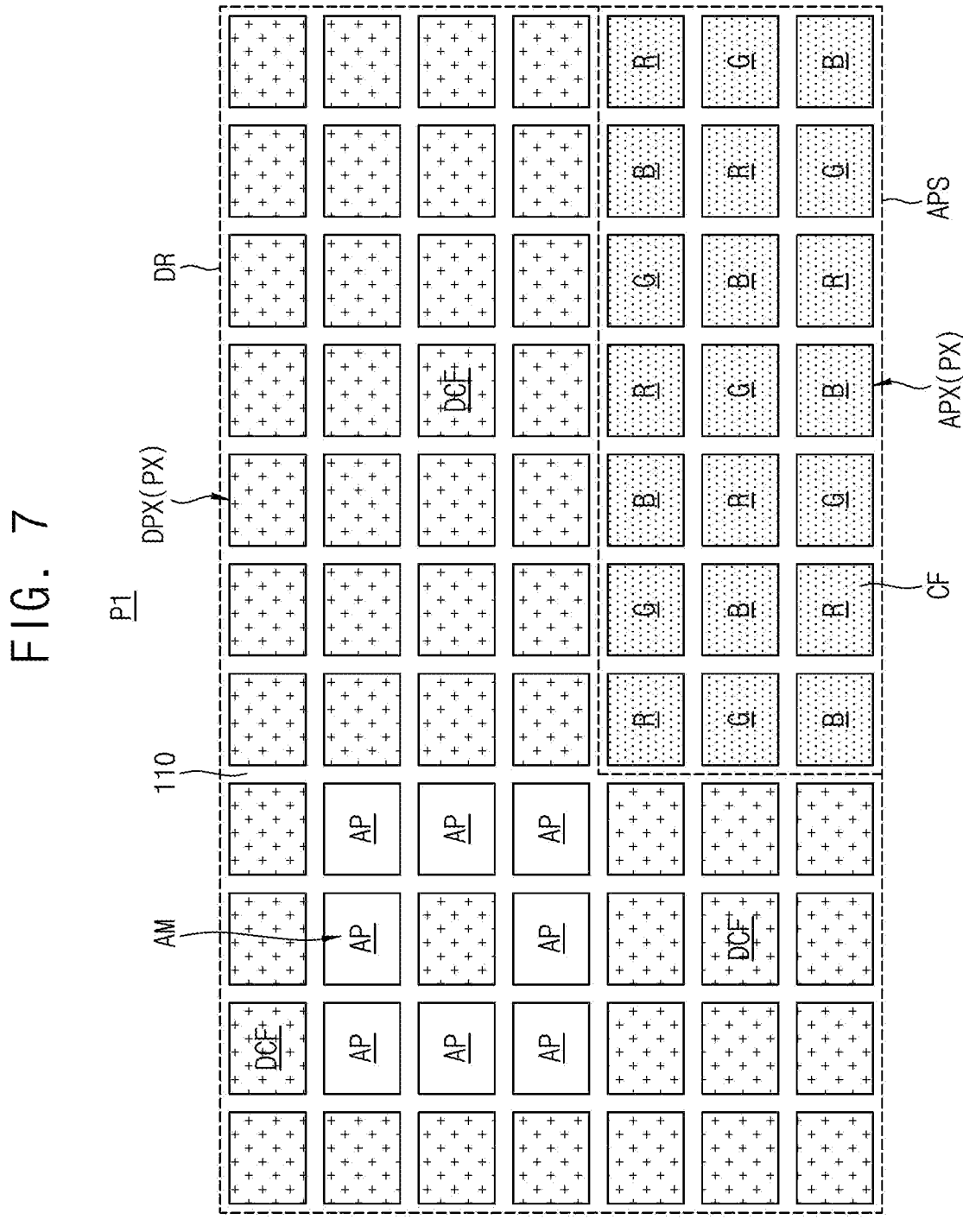
FIGS. 7 and 8 are partial plan views of an image sensor chip according to embodiment of the present disclosure.
Figure 8:
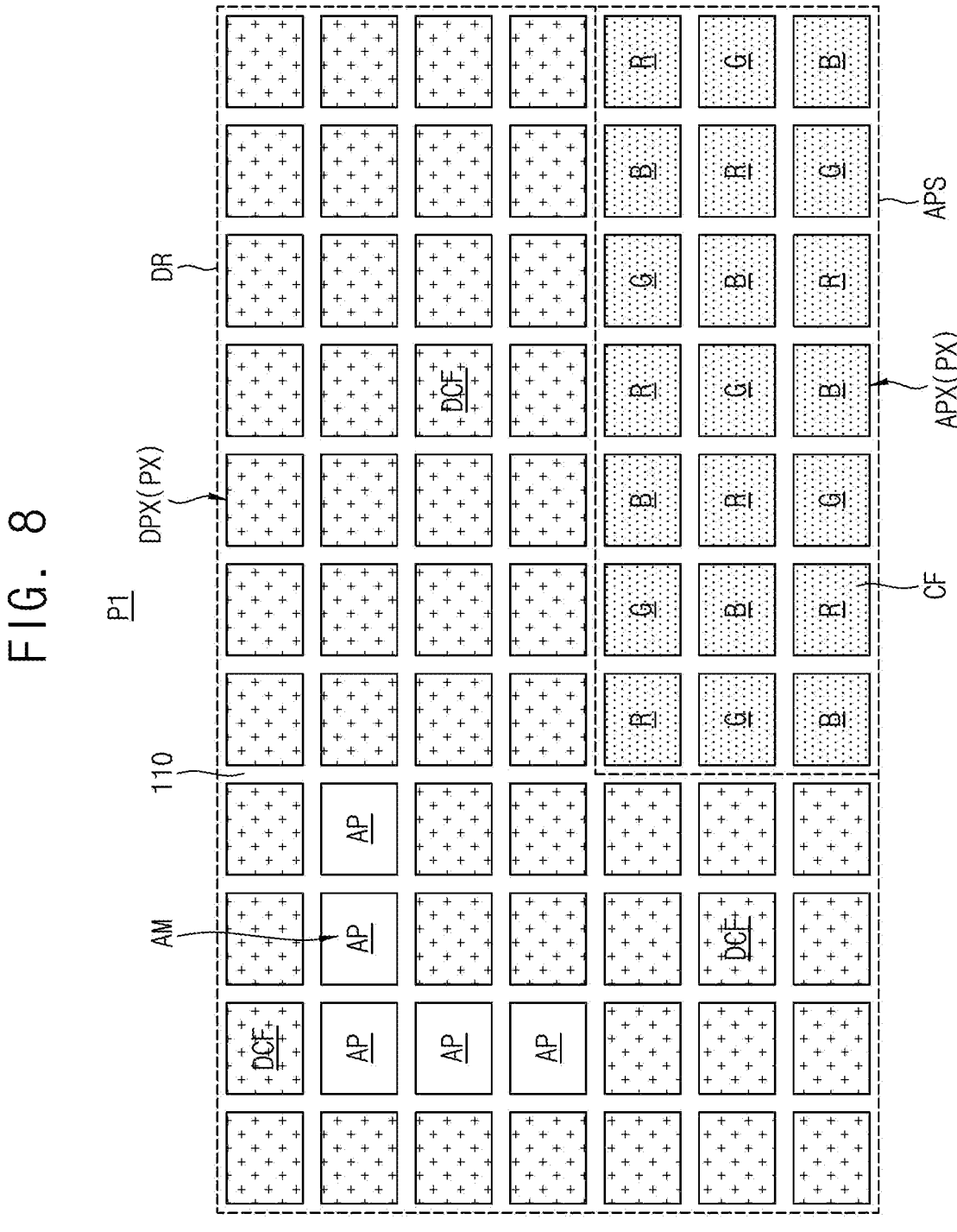

FIGS. 7 and 8 are partial plan views of an image sensor chip according to embodiments of the present disclosure.

Referring to FIG. 7, an alignment mark layer AM may have a rectangular ring shape as a visually recognizable shape. A plurality of alignment mark patterns AP included in the alignment mark layer AM may be arranged along the rectangular ring shape. The plurality of alignment mark patterns AP may surround a portion of the dummy color filters DCF in a plan view.

Referring to FIG. 8, an alignment mark layer AM may have an L-shape as a visually recognizable shape. A plurality of alignment mark patterns AP included in the alignment mark layer AM may be arranged along the L-shape. However, the shape of the alignment mark layer AM is not necessarily limited to those shown in FIGS. 7 and 8, and may be various different shapes.

In accordance with embodiments of the present disclosure, an alignment mark may be provided in a dummy pixel region of an image sensor chip included in an image sensor package. Accordingly, alignment accuracy of a glass or a protective tape in the image sensor package may be increased, and the image sensor package may be disposed in a tray in a more precisely aligned state. In addition, the alignment mark may be formed during a process of forming the image sensor chip and, as such, additional costs caused by formation of the alignment mark may be reduced.

While embodiments of the present disclosure have been described with reference to the accompanying drawings, it should be understood by those skilled in the art that various modifications may be made without departing from the scope of the present disclosure and without changing essential features thereof. Therefore, the above-described embodiments should be considered in a descriptive sense only and not for purposes of limitation.

What is claimed is:

1. An image sensor chip comprising:
a wiring layer;
a semiconductor substrate on the wiring layer, the semiconductor substrate comprising a photoelectric converter;
a lattice structure on the semiconductor substrate;
an alignment mark layer disposed on the semiconductor substrate and surrounded by the lattice structure in a plan view;
dummy color filters disposed on the semiconductor substrate and surrounded by the lattice structure in the plan view;
an upper planarization layer on the alignment mark layer and the dummy color filters; and
a light shielding layer disposed between the semiconductor substrate and the alignment mark layer and between the semiconductor substrate and the dummy color filters,
wherein the alignment mark layer and the dummy color filters are disposed at a same level with respect to a top surface of the semiconductor substrate, and
wherein the dummy color filters surround at least a portion of the alignment mark layer in the plan view.

2. The image sensor chip according to claim 1, wherein the alignment mark layer and the upper planarization layer comprise a same material as each other.

3. The image sensor chip according to claim 2, wherein the alignment mark layer and the upper planarization layer are integrated with each other.

4. The image sensor chip according to claim 1, wherein the alignment mark layer and the upper planarization layer comprise acrylate.

5. The image sensor chip according to claim 1, wherein:
the dummy color filters comprise a photoresist material; and
the alignment mark layer does not comprise the photoresist material.

6. The image sensor chip according to claim 1, wherein the dummy color filters comprise at least one of a blue filter and a black filter.

7. The image sensor chip according to claim 1, further comprising a lower planarization layer disposed between the semiconductor substrate and the lattice structure, between the semiconductor substrate and the alignment mark layer and between the semiconductor substrate and the dummy color filters.

8. The image sensor chip according to claim 1, wherein the light shielding layer is disposed between the semiconductor substrate and the lattice structure.

9. The image sensor chip according to claim 1, further comprising an insulating layer disposed on the upper planarization layer.

10. An image sensor chip comprising:

a semiconductor substrate comprising an active pixel region and a dummy pixel region;

a lattice structure on the semiconductor substrate;

color filters disposed in the active pixel region on the semiconductor substrate;

an alignment mark layer disposed in the dummy pixel region on the semiconductor substrate;

dummy color filters disposed in the dummy pixel region on the semiconductor substrate;

an upper planarization layer on the color filters, the alignment mark layer and the dummy color filters; and a light shielding layer disposed between the semiconductor substrate and the alignment mark layer and between the semiconductor substrate and the dummy color filters in the dummy pixel region, wherein the alignment mark layer and the dummy color filters are disposed at a same level with respect to a top surface of the semiconductor substrate, and wherein the dummy color filters surround at least a portion of the alignment mark layer in a plan view.

11. The image sensor chip according to claim 10, wherein the alignment mark layer and the upper planarization layer comprise a same material as each other.

12. The image sensor chip according to claim 10, further comprising a lower planarization layer disposed between the light shielding layer and the alignment mark layer and between the light shielding layer and the dummy color filters.

13. The image sensor chip according to claim 10, further comprising:

a photoelectric converter disposed in the semiconductor substrate, wherein the alignment mark layer vertically overlaps with the photoelectric converter.

14. The image sensor chip according to claim 10, further comprising:

an insulating layer disposed on the upper planarization layer; and a microlens disposed on the insulating layer, wherein the microlens vertically overlaps with the alignment mark layer.

15. The image sensor chip according to claim 10, wherein the alignment mark layer comprises a plurality of alignment mark patterns.

16. The image sensor chip according to claim 15, wherein each of the plurality of alignment mark patterns is surrounded by the lattice structure in the plan view.

17. An image sensor package comprising:

a base substrate;

an image sensor chip disposed on the base substrate;

a transparent protective cover disposed on the image sensor chip;

a dam disposed between the image sensor chip and the transparent protective cover; and a mold layer directly contacting a portion of a top surface of the base substrate and lateral side surfaces of the image sensor chip, the dam and the transparent protective cover, wherein the image sensor chip comprises:

a semiconductor substrate comprising an active pixel region and a dummy pixel region;

a lattice structure on the semiconductor substrate;

color filters disposed in the active pixel region on the semiconductor substrate;

an alignment mark layer disposed in the dummy pixel region on the semiconductor substrate;

dummy color filters disposed in the dummy pixel region on the semiconductor substrate; and a light shielding layer disposed between the semiconductor substrate and the alignment mark layer and between the semiconductor substrate and the dummy color filters in the dummy pixel region, wherein the alignment mark layer and the dummy color filters are disposed at a same level with respect to a top surface of the semiconductor substrate, and wherein the dummy color filters surround at least a portion of the alignment mark layer in a plan view.

18. The image sensor package according to claim 17, wherein a top surface of the alignment mark layer and a top surface of the dummy color filters are co-planar with each other.

19. The image sensor package according to claim 17, wherein the image sensor chip further comprises:

an upper planarization layer disposed on the color filters, the alignment mark layer and the dummy color filters;

an insulating layer disposed on the upper planarization layer; and a microlens disposed on the insulating layer.

20. The image sensor package according to claim 19, wherein the alignment mark layer comprises a same material as the upper planarization layer.

* * * * *